United States Patent
Huang

(10) Patent No.: US 8,244,966 B2
(45) Date of Patent: Aug. 14, 2012

(54) SELF-ADAPTIVE CONTROL METHOD FOR LOGICAL STRIPS BASED ON MULTI-CHANNEL SOLID-STATE NON-VOLATILE STORAGE DEVICE

(75) Inventor: He Huang, Shenzhen (CN)

(73) Assignee: Memoright Memoritech (Wuhan) Co., Ltd., Wuhan (CN)

( * ) Notice: Subject to any disclaimer, the term of this patent is extended or adjusted under 35 U.S.C. 154(b) by 268 days.

(21) Appl. No.: 12/648,197

(22) Filed: Dec. 28, 2009

(65) Prior Publication Data

US 2010/0100669 A1 Apr. 22, 2010

Related U.S. Application Data

(63) Continuation-in-part of application No. PCT/CN2008/071178, filed on Jun. 4, 2008.

(30) Foreign Application Priority Data

Jun. 28, 2007 (CN) .......................... 2007 1 0076246

(51) Int. Cl.
 *G06F 12/00* (2006.01)
(52) U.S. Cl. ................. 711/103; 711/114; 711/E12.016
(58) Field of Classification Search .................. None
 See application file for complete search history.

(56) References Cited

U.S. PATENT DOCUMENTS

| | | | | |
|---|---|---|---|---|
| 6,311,251 B1* | 10/2001 | Merritt et al. | ................ | 711/114 |
| 6,347,359 B1* | 2/2002 | Smith et al. | .................. | 711/114 |
| 6,484,235 B1* | 11/2002 | Horst et al. | ................... | 711/114 |
| 6,519,772 B1* | 2/2003 | Bopardikar | ................. | 725/115 |
| 6,591,338 B1* | 7/2003 | Horst et al. | ................... | 711/114 |
| 6,591,339 B1* | 7/2003 | Horst et al. | ................... | 711/114 |
| 6,609,176 B1* | 8/2003 | Mizuno | ........................ | 711/114 |
| 6,898,668 B2* | 5/2005 | Thompson et al. | .......... | 711/114 |
| 7,346,733 B2* | 3/2008 | Kitamura | ...................... | 711/114 |
| 2005/0132212 A1* | 6/2005 | Haswell | ....................... | 713/193 |
| 2006/0277361 A1* | 12/2006 | Sharma et al. | ............... | 711/114 |
| 2007/0115731 A1 | 5/2007 | Hung | | |

FOREIGN PATENT DOCUMENTS

| | | |
|---|---|---|
| CN | 1673981 A | 9/2005 |
| CN | 1790308 A | 6/2006 |
| CN | 101101569 A | 1/2008 |
| CN | 101101570 A | 1/2008 |

OTHER PUBLICATIONS

Jeff Bonwick, "RAID-Z", Jeff Bonwick's Blog, Nov. 18, 2005, pp. 1-6, http://blogs.oracle.com/bonwick/entry/raid_z.* PC Guide, "RAID Levels 0+1 (01) and 1+0 (10)", Apr. 17, 2001, pp. 1-2, http://www.pcguide.com/ref/hdd/perf/raid/levels/multLevel01-c.html.*
Matt Woodward, "Tao Flash Drives in a RAID-0 Array", 2005, pp. 1-3, http://arstechnica.com/hardware/reviews/2005/04/flash2005.ars/10.*
Jeong-Uk Kang et al., "A Multi-Channel Architecture for High-Performance NAND Flash-Based Storage System", Journal of Systems Architecture 53, Feb. 1, 2007, pp. 644-658.*

* cited by examiner

*Primary Examiner* — Edward Dudek, Jr.
*Assistant Examiner* — Christopher Birkhimer
(74) *Attorney, Agent, or Firm* — Seed IP Law Group PLLC

(57) ABSTRACT

A self-adaptive control method for logical strips based on a multi-channel solid-state non-volatile storage device is provided. The method includes the following steps. Storage space of every channel is divided into a plurality of storage units of equal size. At least one logical strip is set by which the storage units with discrete physical addresses across the channels are organized into a continuous logical space, and a logical strip variable is set for determining the storage units organized by the logical strip. Historical operation information of the storage device is obtained statistically, and the logical strip variable is dynamically adjusted according to the obtained operation information. During data interaction, the data is divided according to the logical strip variable, the divided data is mapped to the storage units of every channel, and parallel reading and writing operations are performed among the channels.

8 Claims, 4 Drawing Sheets

SELF-ADAPTIVE CONTROL METHOD FOR LOGICAL STRIPS BASED ON MULTI-CHANNEL SOLID-STATE NON-VOLATILE STORAGE DEVICE

CROSS REFERENCE TO RELATED APPLICATION

This is a continuation-in-part application of PCT/CN2008/071178 filed on Jun. 4, 2008 which claims priority from Chinese Patent Application No. 200710076246.7 filed on Jun. 28, 2007.

BACKGROUND

1. Technical Field

The present disclosure relates to a logical space organization method of a solid-state non-volatile storage device, and more particularly to a self-adaptive control method for logical strips based on a multi-channel solid-state non-volatile storage device.

2. Description of the Related Art

Hard disks are holding a dominant position in the field of storage devices. At present, solid-state non-volatile storage devices using semiconductor as storage medium, for example, flash memory storage devices gradually prevail. Characteristics of the non-volatile storage devices are illustrated below with a flash memory as an example. The flash memory has emerged suddenly in the storage market and had a rapidly rising market share because it may perform reading/writing and erasing many times and has the characteristics of high density, large capacity, low time consumption in reading and writing operations, non-volatility, and low power consumption. Especially in recent years, the increasingly mature production process, the gradually reduced cost price, and increasingly perfect back-end application technology of the flash memory have all greatly stimulated the flash memory market to a rapid expansion and made the flash memory gradually have equal shares with the hard disk in the storage market. However, due to problems in the manufacturing process, the flash memory has had some unavoidable defects since it came into being. For example, flash memory chips must perform the reading and writing operations in a unit of a sector, and an effective bandwidth of the reading and writing timing of each flash memory chip is no more than 40 MB. These defects have become obstacles to the rapid development of the flash memory. During the application of the flash memory, the flash memory medium can be utilized well only after eliminating the obstacles.

Along with the gradual improvement of the flash memory application technology, users require for increased reading and writing rates of the flash memory device. A read/write rate of an interface of a single-chip or single-channel flash memory device has already been far from satisfying the users' demands. Therefore, almost all the manufacturers of flash memory devices and flash memory controllers are researching and developing an operation mode of multi-channel flash memory chips. Such multi-channel flash memory device may perform flash memory operation on a plurality of channels simultaneously, so that the read/write rate of the interface of the flash memory device can be multiplied.

For such kind of multi-channel flash memory device, since the device normally executes instructions of a host and perform reading, writing, and erasing operations in parallel by a plurality of channels simultaneously, a problem of how to organize the read or written data and a problem of how to organize discrete physical storage spaces in the plurality of channels are inevitably to be faced, which, however, have not been well solved yet in the existing technologies.

One approach is fixing the number of storage units of each channel participating in operations, i.e., the number of storage units of each channel included in each logical strip of the device is fixed. As shown in FIG. 2, firmware in the flash memory designates that m pages in each of n channels of the flash memory device is included in a logical strip (in the figure, n is 4 and m is 2) according to reserved area information, where the page is a storage unit. All the logical strips are connected to form a continuous logical storage space, i.e., the storage space of the device seen by a user.

However, during usage, some problems gradually occur in such organization method. The flash memory device is used by various users, and different users have different purposes. For example, some users mainly use it for storing or frequently writing data. If each of the logical strips is relatively small so that flash memory chips of a plurality of channels are enabled for each writing operation, when data exists in a page with a destination address, effective data in a block including the page must be backed up first, the block is then erased, and the effective data along with the data of this operation is written. Therefore, for the writing process, the smaller a logical strip is, the more blocks to be erased are, which generally need more operation time and causes more consumption to the flash memory device. If each of the logical strips is relatively large so that one writing operation falls within one channel as much as possible, a block including a page with a destination address may only need to perform one erasing operation to realize this writing operation, which saves the time for writing to a large extent and effectively reduces the consumption to the flash memory device. For another example, if some users use the flash memory device only for backup of documents of relatively small data, the documents are read frequently during usage. In such case, if each of the logical strips is relatively large so that data are written into pages in only one channel in previous writing operations, only the one channel is enabled during a read operation, which fails to achieve the purpose of parallel operation and greatly reduces a reading rate of an interface of the device. If a logical strip is capable of being relatively small, the data will be distributed in a plurality of channels which will be simultaneously enabled during the read operation, and thus the reading rate of the interface of the device is multiplied.

It can be seen from the above that a relatively appropriate setting of a size for a logical strip has great influence on a flash memory device. However, the size of the logical strip of a present flash memory storage device has been fixed before using. Even if the device is used by users having different purposes, since the size of the logical strip is fixed, its reading and writing rates during the usage as well as the life span will be greatly affected. Therefore, how to solve the problem of setting the size of the logical strip will exert great influence on a multi-channel flash memory device.

BRIEF SUMMARY OF THE DISCLOSURE

In view of the problem that during an operation of the existing solid-state non-volatile storage device, logical strips cannot be adjusted for different using conditions since they are fixed, one embodiment of the present disclosure is directed to provide a self-adaptive control method for logical strips based on a multi-channel solid-state non-volatile storage device for controlling the logical strips and intelligently adjusting a size of the logical strips using a statistical method by the solid-state non-volatile storage device itself, thereby solving problems resulted from an inappropriate size of the logical strips.

The self-adaptive control method for logical strips based on a multi-channel solid-state non-volatile storage device provided by the present disclosure includes:

Step 1: dividing a storage space of each of a plurality of channels into a plurality of storage units of equal size;

Step 2: setting at least one logical strip by which the storage units with discrete physical addresses across the plurality of channels are organized into a continuous logical space; and setting a logical strip variable for determining the storage units organized by the logical strip;

Step 3: statistically obtaining historical operating information of the storage device, and dynamically adjusting the logical strip variable according to the obtained operation information; and Step 4: during data interaction, dividing the data according to the logical strip variable, mapping the divided data to the storage units of every channel, and performing reading and writing operations parallel among the plurality of channels.

The historical operation information obtained in Step 3 may include at least one of a size of data block to be operated, an operation type, and operation times.

The step of dynamically adjusting the logical strip variable according to the obtained operation information may include determining a value of the logical strip variable according to an occurrence frequency of each operation type.

The step of determining a value of the logical strip variable according to an occurrence frequency of each operation type may include:

setting a threshold, wherein the logical strip is adjusted so that the value of the logical strip variable corresponds an operation type once operation times for the storage device reach the threshold; computing a total number of times of various operations of the device, and when the total number reaches the threshold, adjusting the logical strip variable so that the value thereof is corresponding to an operation type having a largest operation times.

The logical strip variable in Step 2 may correspond to a number of storage units being logically connected in each channel by the logical strip or correspond to the size of the logical strip.

Each storage unit may correspond to a logical strip variable.

The storage unit may be a sector, a page, or a byte.

The logical strip variable may be stored in a redundant area of the storage unit or collectively stored in the storage device.

The solid-state non-volatile storage device may include a flash memory device.

When a value of the logical strip variable is to be adjusted, the method may further include backing up the existing data stored in the storage device.

The method further may include dividing the storage device into a plurality of logical partitions and performing a reading and writing control on each logical partition respectively according to Steps 1, 2, 3, and 4.

An advantage of employing the self-adaptive control method for logical strips of the solid-state non-volatile storage device of the embodiment of the present disclosure mainly lies in that the size of the logical strips is variable so that the device may self-adaptively set the size of the logical strips by using an algorithm according to operation history records. Therefore, the device may better satisfy the users' demands, thereby increasing the operational efficiency of the solid-state non-volatile storage device and the operating life span of the flash memory.

BRIEF DESCRIPTION OF THE SEVERAL VIEWS OF THE DRAWINGS

The present disclosure will become more fully understood from the detailed description given herein below for illustration only, and thus are not limitative of the present disclosure, and wherein.

DETAIL DESCRIPTION DISCLOSURE

The present disclosure emphasizes on setting a size of a logical strip to adapt to different applications and users according to historical operation records of a solid-state non-volatile storage device through a self-adaptive algorithm, so as to increase the efficiency of reading and writing operations of the solid-state non-volatile storage device and the life span of the flash memory device. A flash memory device is illustrated in detail below in an embodiment in which a solid-state non-volatile storage device is applied, and implementations of other storage devices are essentially the same as that of the flash memory device.

Figure 1:
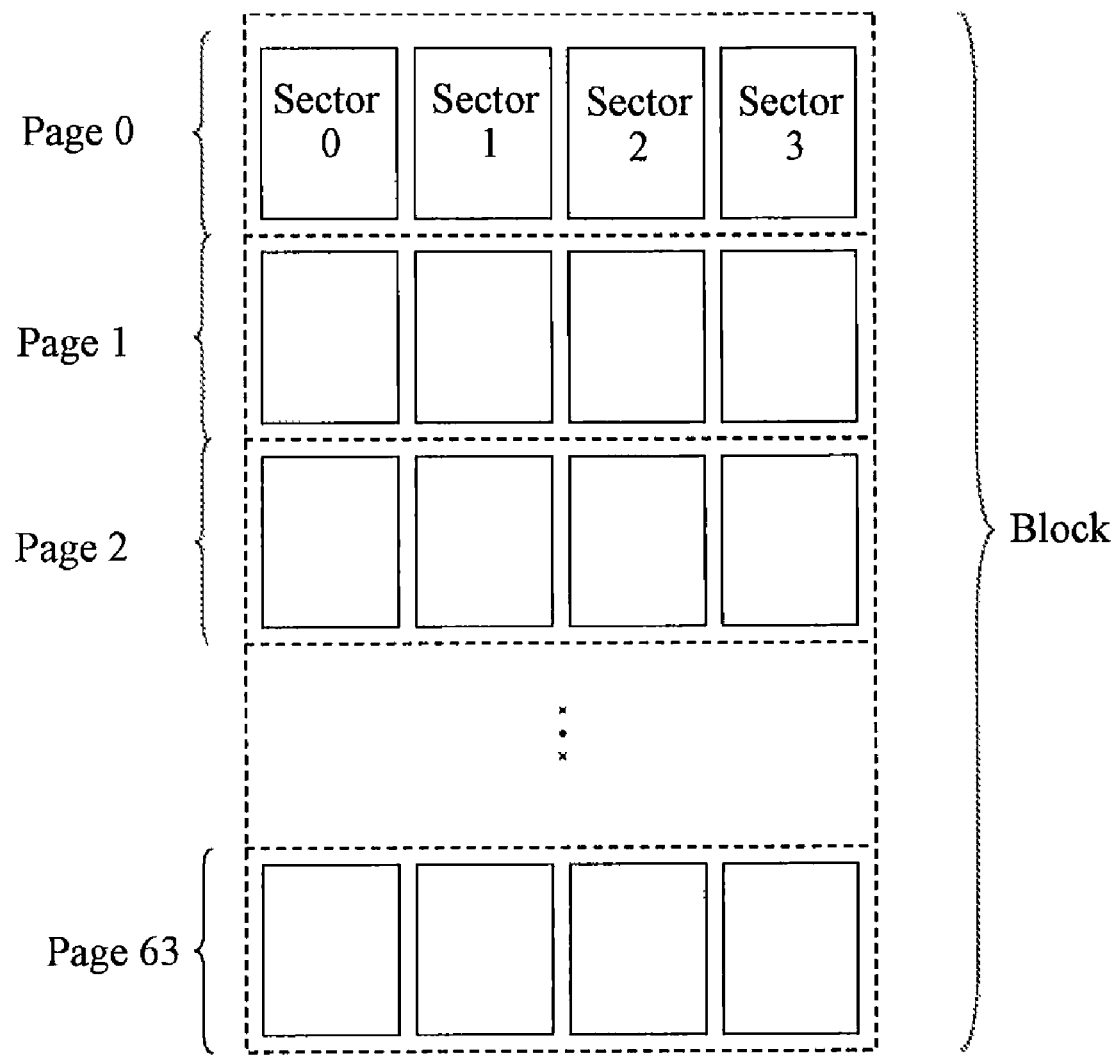
FIG. 1 is a schematic view illustrating a physical block of a flash memory device according to a preferred embodiment of the present disclosure.

As shown in FIG. 1, a method for dividing flash memory chips in this embodiment is as follows. A sector has 528 bytes (1 byte contains 8 bits) including an effective data area of 512 bytes and a redundant area of 16 bytes. Then, 4 sectors form a page, and 64 pages form a physical block. For a multi-channel flash memory device, as shown in FIG. 2, m pages of each of n channels form a logical strip across the n channels, wherein n is a fixed value and represents the number of the channels of the device, and the value of m is determined by a strategy of the device.

In this embodiment, a page may be a storage unit. By using the logical strip, firmware can organize physical pages of flash memory chips. Since the multi-channel flash memory device performs operations by a plurality of channels, the read or written data is inevitably in different flash memory chips, resulting in a discontinuous distribution of physical space. However, for mapping and organization, logical space must be continuous. In other words, it is the logical strip that organizes the discontinuous physical pages into a continuous logical space.

Figure 2:
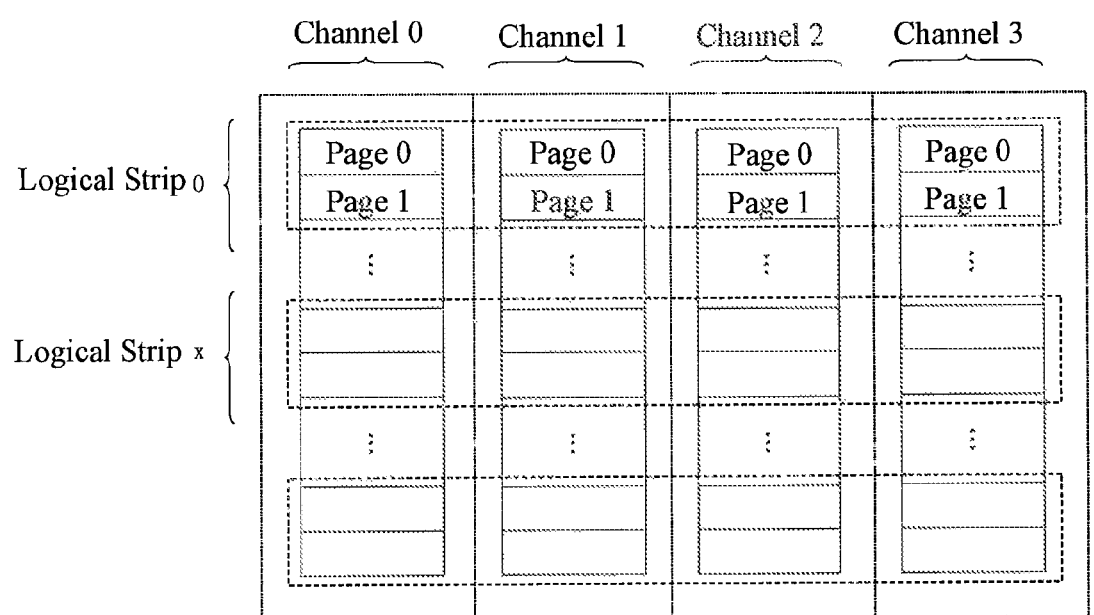
FIG. 2 is a schematic view illustrating logical blocks of a multi-channel flash memory storage device.

FIG. 2 shows logical strips of a multi-channel flash memory storage device. As exemplified in the figure, the number of channels, n, is 4, and the number of pages of each channel in a logical strip, m, is 2. Therefore, each of the logical strips, such as a starting logical strip 0 and a logical strip X shown in the figure, of the multi-channel flash memory device has a size of 16 KB as shown in this example.

The present disclosure is illustrated in detail below through the accompanying drawings in combination with embodiments.

Operation types of the flash memory device are divided according to values of data to be operated, for example 2 k, 4 k and 8 k. The operation types include a reading operation in which a size of data to be operated is smaller than 2 k (<2 k reading), a writing operation in which a size of data to be operated is smaller than 2 k (<2 k writing), a reading operation in which a size of data to be operated is 2 k-4 k (2 k-4 k reading), a writing operation in which a size of data to be operated is 2 k-4 k (2 k-4 k writing), a reading operation in which a size of data to be operated is 4 k-8 k (4 k-8 k reading), a writing operation in which a size of data to be operated is 4 k-8 k (4 k-8 k writing), a reading operation in which a size of data to be operated is more than 8 k (>8 k reading), and a writing operation in which a size of data to be operated is more than 8 k (>8 k writing). The number of channels may be 4. In this embodiment, the values of a size of a preferred logical strip corresponding to every type are described as follows. The size of the logical strip corresponding to the types of <2 k reading, <2 k writing, 2 k-4 k reading, 4 k-8 k reading, and >8 k reading is 8K, the size of the logical strip corresponding to the type of 2 k-4 k writing is 16K, and the size of the logical strip corresponding to the types of 4 k-8 k writing and >8 k writing is 32K. A threshold of operation times may be set to be 10,000. That is to say, each time the flash memory device is operated 10,000 times, a self-adaptive adjustment is made on the logical strips of the flash memory device.

Historical operating information of the flash memory device will be obtained statistically and stored in a reserved information area of the flash memory device by the firmware in the flash memory device. The historical operating information includes operation data block size, operation type, and operation times, and in this embodiment, the historical operation information is the operation times corresponding to each operation type. Each time the total number of operation times reaches 10,000, the operations of different types are compared to determine an operation having the highest use frequency, and the size of the logical strip of the device is set to be a value corresponding to the operation having the highest use frequency.

Figure 3:
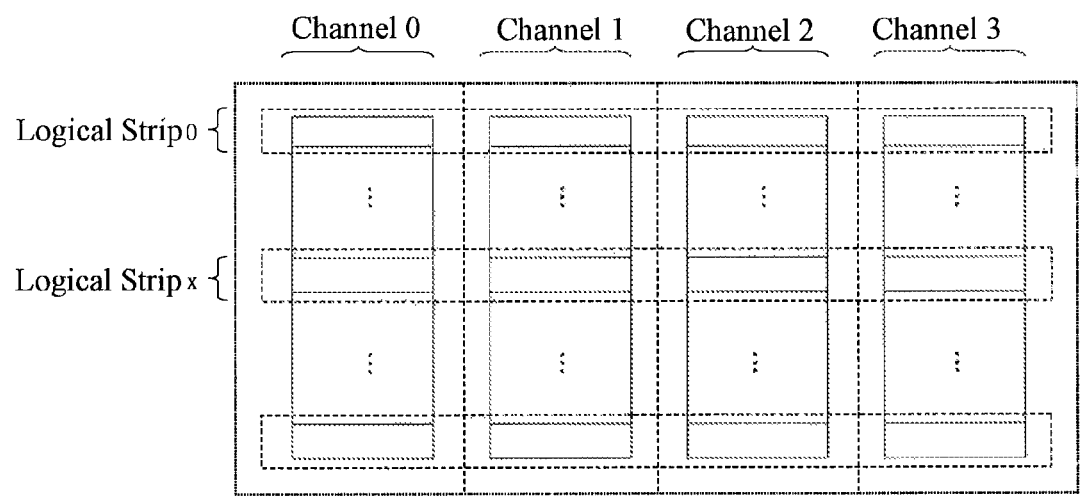
FIG. 3 is a schematic view of small logical strips of a multi-channel flash memory storage device according to a preferred embodiment of the present disclosure.

As shown in FIG. 3, when a user intends to frequently perform a single reading operation on data of a small size on the flash memory device or a certain logical partition in the flash memory device, if an operation with a type of <2 k reading, <2 k writing, or a reading operation in which a size of data to be read is 2 k or more is operated more frequently than an operation with one of the other types, in order to ensure the operation speed of the flash memory device, a corresponding adjustment can be made on the logical strips by use of the embodiment of the present disclosure. As shown in the figure, when the data has an average size smaller than 2 k, the size of the logical strip is correspondingly adjusted to be 8K, which both enables each writing operation to fall within one channel so as to sufficiently increase the speed of the writing operation, and satisfies the principle that a reading operation should be performed parallel among a plurality of channels as much as possible. When a reading operation on data of a size of 2 k or more is frequently performed on the flash memory device or a logical partition of the device, the size of the logical strip may be selected to be the smallest, for example, 8K. In this way, as many channels as possible are enabled during the reading operation to sufficiently increase the reading rate of an interface of the storage device.

Figure 4:
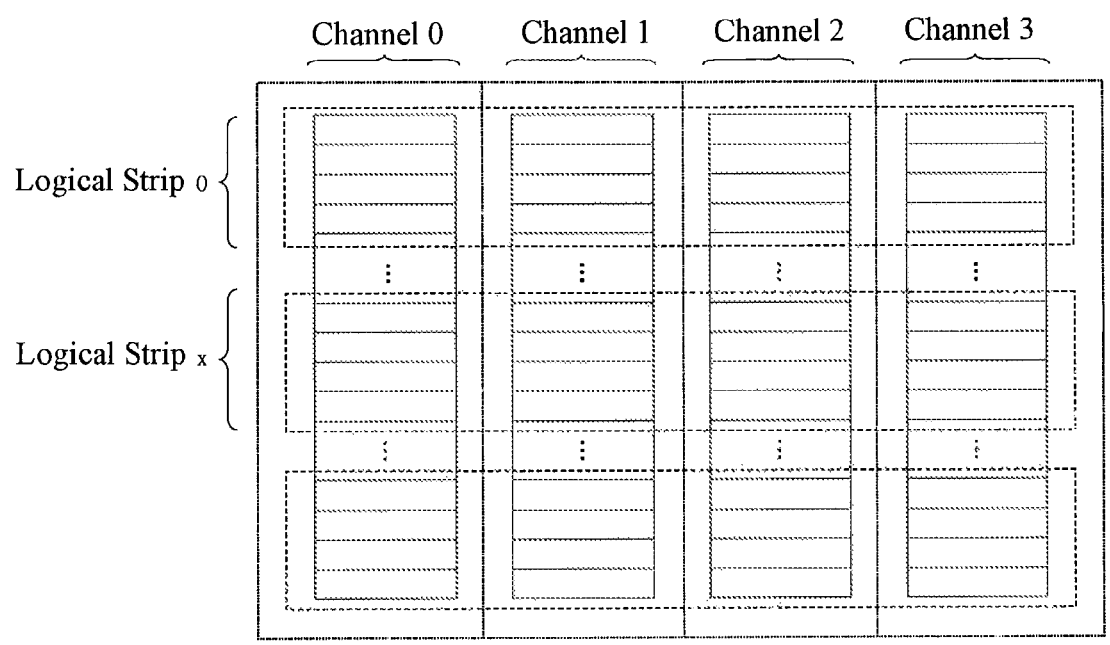
FIG. 4 is a schematic view of large logical strips of a multi-channel flash memory storage device according to a preferred embodiment of the present disclosure.

As shown in FIG. 4, when an operation with a type of >8 k writing or 4 k-8 k writing is performed more frequently than an operation with one of the other types, the size of the logical strip is adjusted to be 32K as shown in the figure. When a user intends to frequently perform writing operations many times on the flash memory device, considering the efficiency and the interface rate of the flash memory device during the writing operation, as well as the consumption of the flash memory chips, the size of the logical strip is correspondingly adjusted, according to the present disclosure, to a size of 32K. Before writing new data to a flash memory chip of each channel, the old data in the destination block must be erased, and the erasing of the block is very time-consuming and shortens the life span of the flash memory chip. Therefore, it's better to enable fewer channels in each operation. During the writing operation, the larger the size of a logical strip is, the less the erasing operations is performed, and the less the time consumed by the operations as well as the abrasion of the flash memory chip is, thereby effectively increasing the writing rate of the interface of the flash memory device and prolonging the life span of the device.

In addition, when a value of a logical strip variable of the device is needed to be adjusted, effective data stored in the flash memory device may be backed up. An automatic backup by software may be employed. Alternatively, a user having been notified by a human-machine interface may perform the backup before the size of the logical strip is adjusted.

When the flash memory device includes a plurality of logical partitions, each of the different logical partitions has a different logical strip variable. The size of the logical strip can be intelligently adjusted according to users' different purposes and different logical partitions.

The present disclosure is illustratively described by the above embodiments. In addition, the present disclosure has many implementations with a main purpose of setting a size of a logical strip according to historical operation records of the flash memory device through a self-adaptive algorithm, so as to increase the speed and efficiency of reading and writing operations of the flash memory device, and prolong the operating life span of the flash memory device. The present disclosure uses an embodiment for illustration, and it is apparent to those skilled in the art that the present disclosure also has other implementations which are under the principle of the present disclosure. In addition, the storage device provided in the present disclosure includes, but not limited to, a flash memory device such as NAND and NOR, and other storage devices to have similar organizations of logical strips all fall within the principle and scope of the present disclosure, which are apparent to those skilled in the art and is within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A self-adaptive control method for logical strips based on a multi-channel solid-state non-volatile storage device, comprising:
   Step 1: dividing a storage space of each of a plurality of channels into a plurality of storage units of equal size;
   Step 2: setting at least one logical strip by which storage units with discrete physical addresses across the plurality of channels are organized into a continuous logical space, and setting a logical strip variable for determining the storage units organized by the logical strip;
   Step 3: statistically obtaining historical operation information of the storage device, wherein the historical operation information comprises an operation type, and determining a value of the logical strip variable according to an occurrence frequency of each operation type to dynamically adjust the logical strip variable; and Step 4: during data interaction, dividing the data according to the logical strip variable, mapping the divided data to the storage units of every channel, and performing reading and writing operations parallel among the plurality of channels, wherein the step of determining a value of the logical strip variable according to an occurrence frequency of each operation type comprises:

setting a threshold, wherein the logical strip is adjusted so that the value of the logical strip variable corresponds to an operation type once operation times for the storage device reach the threshold; computing a total number of times of various operations of the device, and when the total number reaches the threshold, adjusting the logical strip variable so that the value thereof corresponds to an operation type having a largest operation times.

2. The self-adaptive control method for logical strips based on a multi-channel solid-state non-volatile storage device as claimed in claim 1, wherein the historical operation information further comprises a size of data block to be operated and operation times.

3. The self-adaptive control method for logical strips based on a multi-channel solid-state non-volatile storage device as claimed in claim 1, wherein the logical strip variable in Step 2 corresponds to a number of storage units being logically connected in each channel by the logical strip or corresponds to the size of the logical strip.

4. The self-adaptive control method for logical strips based on a multi-channel solid-state non-volatile storage device as claimed in claim 1, wherein each storage unit corresponds to one logical strip variable.

5. The self-adaptive control method for logical strips based on a multi-channel solid-state non-volatile storage device as claimed in claim 1, wherein the storage unit is a sector, a page, or a byte.

6. The self-adaptive control method for logical strips based on a multi-channel solid-state non-volatile storage device as claimed in claim 1, wherein the multi-channel solid-state non-volatile storage device comprises a flash memory device.

7. The self-adaptive control method for logical strips based on a multi-channel solid-state non-volatile storage device as claimed in claim 1, wherein when a value of the logical strip variable is to be adjusted, the method further comprises backing up the existing data stored in the storage device.

8. The self-adaptive control method for logical strips based on a multi-channel solid-state non-volatile storage device as claimed in claim 1, further comprising dividing the storage device into a plurality of logical partitions and performing a reading and writing control on each logical partition respectively according to Steps 1, 2, 3, and 4.

* * * * *